United States Patent [19]

Kimura

[11] Patent Number: 5,319,267
[45] Date of Patent: Jun. 7, 1994

[54] FREQUENCY DOUBLING AND MIXING CIRCUIT

[75] Inventor: Katsuji Kimura, Tokyo, Japan

[73] Assignee: NEC Corporation, Tokyo, Japan

[21] Appl. No.: 824,216

[22] Filed: Jan. 22, 1992

[30] Foreign Application Priority Data

Jan. 24, 1991 [JP] Japan ................................. 3-23923
Jan. 29, 1991 [JP] Japan ................................. 3-28060
Feb. 28, 1991 [JP] Japan ................................. 3-57917

[51] Int. Cl.$^5$ .......................... G06G 7/12; G06G 7/16
[52] U.S. Cl. .................................. 307/529; 307/494;
330/252; 330/257; 328/156; 328/160
[58] Field of Search ............... 307/529, 494; 330/252,
330/257; 328/156, 160

[56] References Cited

U.S. PATENT DOCUMENTS

| | | | |
|---|---|---|---|
| 3,812,434 | 5/1974 | Lommers et al. | 330/252 |
| 4,061,932 | 12/1977 | Cordell | 330/252 |
| 4,694,204 | 9/1987 | Nishijima et al. | 307/494 |
| 4,833,340 | 5/1989 | Deguchi | 307/494 |
| 4,937,516 | 6/1990 | Sempel | 307/529 |
| 5,001,372 | 3/1991 | Nyquist | 307/529 |
| 5,006,727 | 4/1991 | Ragosch et al. | 307/494 |
| 5,086,241 | 2/1992 | Nakayama | 307/494 |
| 5,184,086 | 2/1993 | Inahana et al. | 330/252 |

*Primary Examiner*—Margaret R. Wambach
*Attorney, Agent, or Firm*—Sughrue, Mion, Zinn, Macpeak & Seas

[57] ABSTRACT

Disclosed is a frequency doubling and mixing circuit capable of effecting frequency doubling operation and mixing operation with one unit of circuit. It includes a first set of differential transistor-pair which have emitters connected in common and an emitter size ratio of K:1 (K is larger than 1), and a second set of differential transistor-pair which similarly have emitters connected in common and an emitter size ratio of K:1. These two sets of differential transistor-pairs have respective constant electric currents supplied. In addition, it has a differential amplifying circuit which is driven by a differential current between the common collector output of one transistor of the first set of differential transistor-pair and one transistor of the second set of differential transistor-pair and the common collector output between the other transistor of the first set of differential transistor-pair and the other transistor of the second set of differential transistor-pair. A signal to be doubled is supplied across the common base connecting points of the transistors which are different in emitter size, a mixing signal is supplied from a differential input terminal of said differential amplifying circuit, and a circuit output is taken out from an output terminal or said differential amplifying circuit.

18 Claims, 8 Drawing Sheets

FREQUENCY DOUBLING AND MIXING CIRCUIT

BACKGROUND OF THE INVENTION

1. Field of the Invention

This invention relates to a frequency doubling and mixing circuit effecting a frequency doubling operation and a frequency mixing operation.

2. Description of the Prior Art

In case of effecting a frequency doubling operation and mixing operation, conventionally, an input signal frequency (local osillator frequency in this example) is doubled by a frequency doubler 51 and sent through a band-pass filter 52 to a mixer 53 as shown in FIG. 1. The signal thus sent to the mixer 53 is mixed with another signal inputted thereto. With the arrangement as shown above, however, it is required that the frequency doubler 51 and the frequency mixer 53 are structured independently of each other and the filter 52 is provided therebetween as shown in FIG. 1. Consequently, a problem exists such that the frequency characteristic cannot be provided on broad-band basis, and it is difficult to integrate the entire circuit. In addition, reduction in power consumption is difficult due to the fact that the number of circuit elements to be used becomes large, and the number of terminals is unavoidably increased because the filter is to be provided outside.

In consideration of the above-mentioned problems, an object of this invention is to provide a frequency doubling and mixing circuit in which the frequency doubling and mixing operations can be achieved by one unit of circuit.

SUMMARY OF THE INVENTION (1) According to a first aspect of this invention, a frequency doubling and mixing apparatus of this invention has a first differential transistor-pair whose emitters are connected in common and an emitter size ratio of K:1 (K is larger than one), and a second differential transistor-pair which similarly has its emitters connected in common and an emitter size ratio of K:1. The first differential transistor-pair is biased by a constant electric current from a first constant current source and the second differential biased by a constant electric current from second constant current source. In addition, it is equipped with a differential amplifying circuit which is driven by a differential current between a common collector output of the transistors each having a large emitter size of said first and second differential transistor-pairs and a common collector output of the transistors each having a smaller emitter size of said first and second differential transistor-pairs as its power source. A signal to be doubled is supplied across the common base contact points of the transistors which are different in emitter size from each other of said first and second differential transistor-pairs, and a mixing signal is supplied from a differential input terminal of the differential amplifying circuit. A circuit output is taken from an output terminal of said differential amplifying circuit.

The frequency doubling and mixing circuit according to the first aspect of this invention may be arranged such that a resistor is inserted in series into an emitter of each of the transistors forming said first and second differential transistor-pairs. As values of such emitter resistors to be inserted, it is preferable that, for example, when one transistor has an emitter resistor value, of RE, the other transistor has an emitter resistor value of RE/K in order to satisfy an emitter size ratio of K:1.

In the frequency doubling and mixing circuit in the first aspect of this invention, the frequency doubling circuit and the mixing circuit are connected through a current mirror circuit directly to each other, so that the doubling operation of a signal to be multiplied and the mixing operation of thus doubled signal with a mixing signal can be carried out by one unit of circuit. Also, such a circuit can be practically realized with a small number of elements to be used, and reductions in circuit scale and power consumption can be realized.

(2) According to a second aspect of this invention, in a frequency doubling and mixing circuit of this invention, a signal to be doubled is supplied from a first input terminal-pair and a signal to be mixed therewith is supplied from a second input terminal. In addition, it has two differential transistor-pairs in which only one transistor of each pair has an emitter resistor, and the collector of the transistors each having an emitter resistor and the collector of the transistors each not having an emitter resistor of these two differential transistor-pairs are connected in common, and one of the bases of the transistors each having an emitter resistor and one of the bases of the transistors each not having an emitter resistor are connected in common to one input terminal of said first input terminal pair, and the other bases thereof are connected in common to the other input terminal of said first input terminal-pair. In addition, two transistors are provided, the collectors of which are connected respectively to emitters of the transistors each not having an emitter resistor of said two sets of differential transistor-pairs, and the bases of which are connected in common to said second input terminal.

In the frequency doubling and mixing circuit according to the second aspect, two differential transistor-pairs which are different in emitter size may be used instead of the two differential transistor-pairs in which one transistor only of each pair has an emitter resistor. In addition, using two differential transistor-pairs which are different in emitter size, an emitter resistor having a resistance value of RE/K may be inserted into an emitter of a transistor with a larger emitter size, and an emitter resistor having a resistance value of RE may be inserted into an emitter of a transistor with a smaller emitter size, thus being capable of advantageously improving the amplitude level of an input signal VLO.

Further in addition, similar to the first aspect, in the second aspect, the frequency doubling operation of a signal to be doubled and the mixing operation of thus doubled signal with a mixing signal can be carried out by one unit of circuit.

(3) According to a third aspect of this invention, a frequency doubling and mixing circuit of this invention has a first input terminal-pair for receiving a signal to be doubled and a second input terminal-pair for receiving a mixing signal. In addition, it has a first differential amplifying circuit consisting of two differential transistor-pairs in which only one transistor of each pair has an emitter resistor and the collector of the transistors each having an emitter resistor and the collector of the transistors each not having an emitter resistor of these two differential transistor-pairs are connected in common, one of the bases of the transistors each having an emitter resistor and one of the bases of the transistors each not having an emitter resistor are connected in common to one input terminal of said first input terminal pair and the other bases thereof are connected in common to the other input terminal thereof. In addition, the emitters of the transistors of each pair are respectively connected to constant current sources. Further in addition, it has a second differential amplifying circuit consisting of differential transistor-pair in which one base thereof is connected to one input terminal of said second input terminal-pair and the other base thereof is connected to the other input terminal of said second input terminal-pair. The second differential amplifying circuit is driven by a current mirror circuit in response to a differential current obtained from each output of said first differential amplifying circuit.

With the frequency doubling and mixing circuit according to the third aspect, it is preferable to has such a circuit that can control said current mirror circuit so as to drive said second differential amplifying circuit by an electric current obtained by subtracting a constant value of direct current from said differential current. Such control circuit is preferable to be consisted of a constant current source which is inserted in parallel into one of the transistors forming said current mirror circuit.

In the circuit according to the third aspect, said first differential amplifying circuit constitutes a frequency doubling circuit and the second differential amplifying circuit constitutes a mixing circuit, which are directly connected through a current mirror circuit with each other. As a result, even in this case, the frequency doubling operation of a signal to be doubled and a mixing operation of a signal to be mixed therewith can be carried out by one unit of circuit.

In case of being equipped with a control circuit of said current mirror circuit, a constant value of direct current is subtracted from a differential current obtained from respective outputs of the first differential amplifying circuit as the frequency doubling circuit, and the second amplifying circuit as the mixing circuit is driven in response to the current thus obtained by the above subtraction, so that a double frequency component extremely superior in distortion factor becomes predominant as the driving current of the second differential amplifying circuit, thus being effective to improve the conversion gain of the mixing circuit.

DESCRIPTION OF THE PREFERRED EMBODIMENTS

Figure 1:
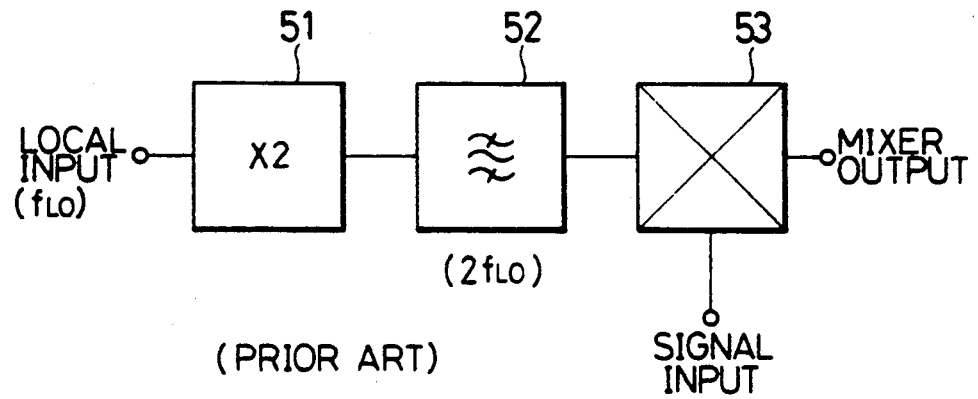
FIG. 1 is a circuit diagram of a frequency doubling and mixing circuit of the prior art.

Preferred embodiments of this invention will be described below while referring to the drawings attached.

FIRST EMBODIMENT

Figure 2:
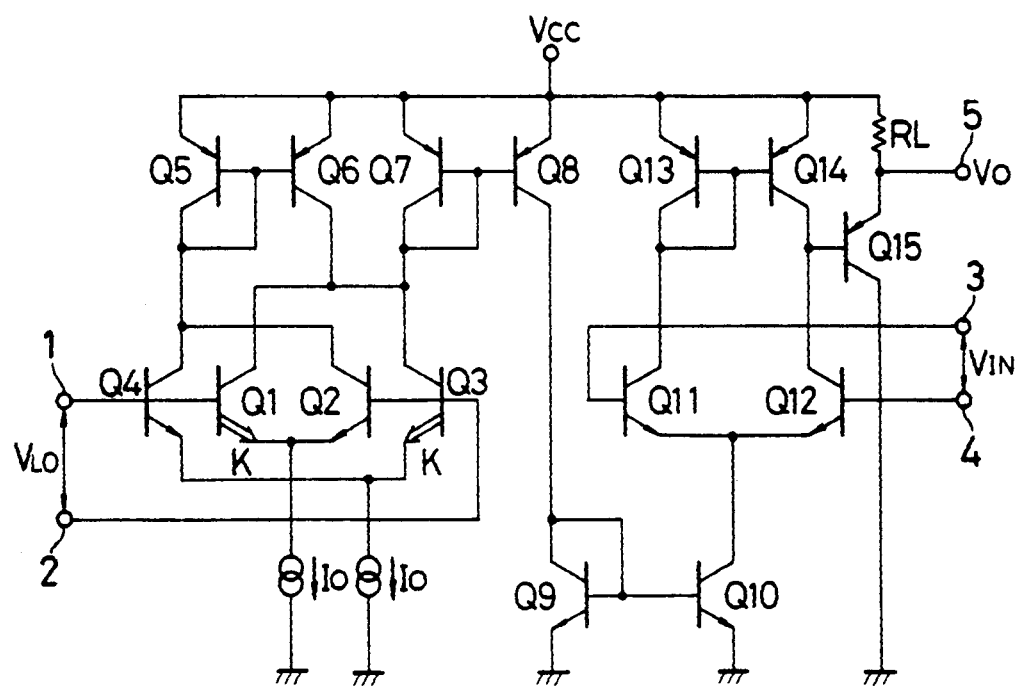
FIG. 2 is a circuit diagram of a frequency doubling and mixing circuit according to a first embodiment of this invention.

A frequency doubling and mixing circuit according to a first embodiment of this invention is shown in FIG. 2. In FIG. 2, a first differential transistor-pair Q1 and Q2 respectively has emitters which are connected in common and have an emitter size (emitter area) ratio of k:1 (k>1). To the common connection point of the emitters of the transistors Q1 and Q2 is connected a constant current source IO. A second differential transistor-pair Q3 and Q4 respectively has emitters which are connected in common and have the same emitter size ratio as of the transistors Q1 and Q2, or k:1 (k>1). The emitter common connection point of the transistors Q3 and Q4 also is connected to the constant current source IO. A signal (local oscillator signal in this embodiment) VLO is applied through input terminal-pair 1 and 2 across the common base of the transistors Q1 and Q4 and that of the transistors Q2 and Q3. In addition, a differential current between a common collector output of the transistors Q1 and Q3 and that of the transistors Q2 and Q4 is derived by a current mirror circuit consisting of transistors Q5 to Q8. The differential current output derived by this current mirror circuit is provided to another current mirror circuit consisting of transistors Q9 and Q10 to drive a differential amplifier consisting of transistors Q11 and Q12.

The transistors Q11 and Q12 is a differential transistor-pair having emitters connected in common. Across the bases of the transistors Q11 and Q12, an input signal VIN to be mixed is applied through output terminals 3 and 4. A differential output of the differential amplifier consisting of the transistors Q11 and Q12 is derived by a current mirror load through the transistors Q13 and Q14, and a circuit output. VO is obtained by an emitter follower circuit consisting of a transistor Q15 and a resistance RL.

When a DC amplification factor of transistor is expressed by, $\alpha$ collector currents Ic1 to Ic4 of the transstors Q1 to Q4 become as follows;, where $VT = kT/q$, k is Boltzman's constant, T is absolute temperature, q is the charge of an electron, and K is an emitter size ratio.

$$Ic1 = \frac{\alpha I0}{\{1 + (1/K)\exp(-VLO/VT)\}} \quad (1)$$

$$Ic2 = \frac{\alpha I0}{\{1 + K\exp(VLO/VT)\}} \quad (2)$$

$$Ic3 = \frac{\alpha I0}{\{1 + (1/K)\exp(VLO/VT)\}} \quad (3)$$

$$Ic4 = \frac{\alpha I0}{\{1 + K \exp(-VLO/VT)\}} \quad (4)$$

From Eqs. (1) to (4), therefore, the sum Ip of the collector currents Ic1 and Ic3 and the sum Iq of the collector currents Ic2 and Ic4 can be expressed as follows;

$$\begin{aligned} Ip &= Ic1 + Ic3 \\ &= \alpha \cdot I0 \left[ \frac{1}{1 + (1/K) \exp(-VLO/VT)} + \frac{1}{1 + (1/K) \exp(VLO/VT)} \right] \end{aligned} \quad (5)$$

$$\begin{aligned} Iq &= Ic2 + Ic4 \\ &= \alpha \cdot I0 \left[ \frac{1}{1 + K \exp(-VLO/VT)} + \frac{1}{1 + K \exp(VLO/VT)} \right] \end{aligned} \quad (6)$$

Hence, a difference $\Delta$ Ip,q of Ip and Iq becomes as follows; where $VK = VT \cdot (\ln K)$ $$\begin{aligned} \Delta Ip,q &= Ip - Iq = (Ic1 - Ic2) - (Ic4 - Ic3) \\ &= \alpha \cdot I0 \cdot \tanh[(VLO + VK)/2VT] - \\ &\quad \alpha \cdot I0 \cdot \tanh[(VLO - VK)/2VT] \\ &= \alpha \cdot I0 \cdot \{\tanh[(VLO + VK)/2VT] - \\ &\quad \tanh[(VLO - VK)/2VT] \} \end{aligned} \quad (7)$$

In this case, $\Delta$ Ip,q becomes an even function with respect to VLO.

Next, when $x \ll 1$, $\tanh x$ can be expanded in series as;

$$\tanh x = x - (x^3/3) + \ldots \quad (8)$$

From this, $$\Delta Ip,q = (\alpha \cdot I0/4VT) \cdot (\ln K) \cdot \quad (9)$$
$$\times \{1 - (\ln K)^2/12 - [1/4(VT)^2] \cdot VLO^2 \ldots \}$$

Here, Eq. (9) can be approximated as follows;

$$\Delta Ip,q \approx (\alpha \cdot I0/4VT) \cdot (\ln K) \cdot \quad (10)$$
$$\times \{1 - (\ln K)^2/12 - [1/4(VT)^2] \cdot VLO^2 \ldots \}$$

Accordingly, the $\Delta$ Ip,q can be approximately expressed in terms of an equation involving only the term of the square of input signal VLO, and if the DC component is removed, it is found that almost of the frequency components contained in the differential current Ip,q are of a frequency of 2 fLO as compared with an input signal frequency of fLO. The reason of this is that if the signal is a sine wave, then, $$2 \sin^2 A = 1 - \cos 2A$$

thus being obtainable a frequency component double in frequency as compared with the DC component. As shown above, a circuit consisting of the transistors Q1 to Q8 becomes a frequency multiplying circuit.

In this case, however, if the Ip,q when it is no signal (VLO=0) is expressed as IDp,q, ID becomes a direct current, from Eq. (7), the following equation can be obtained;

$$IDp,q = 2\alpha \cdot I0 \cdot \tanh[(\ln K)/2] \quad (11)$$

The value thus obtained is identical to the value obtained when VLO=0 in Eq. (10). This means that $\Delta$ Ip,q can be obtained by superposing an AC component with a frequency of 2 fLO onto the DC component IDp,q, the characteristics of which are shown in FIG. 3.

Figure 3:
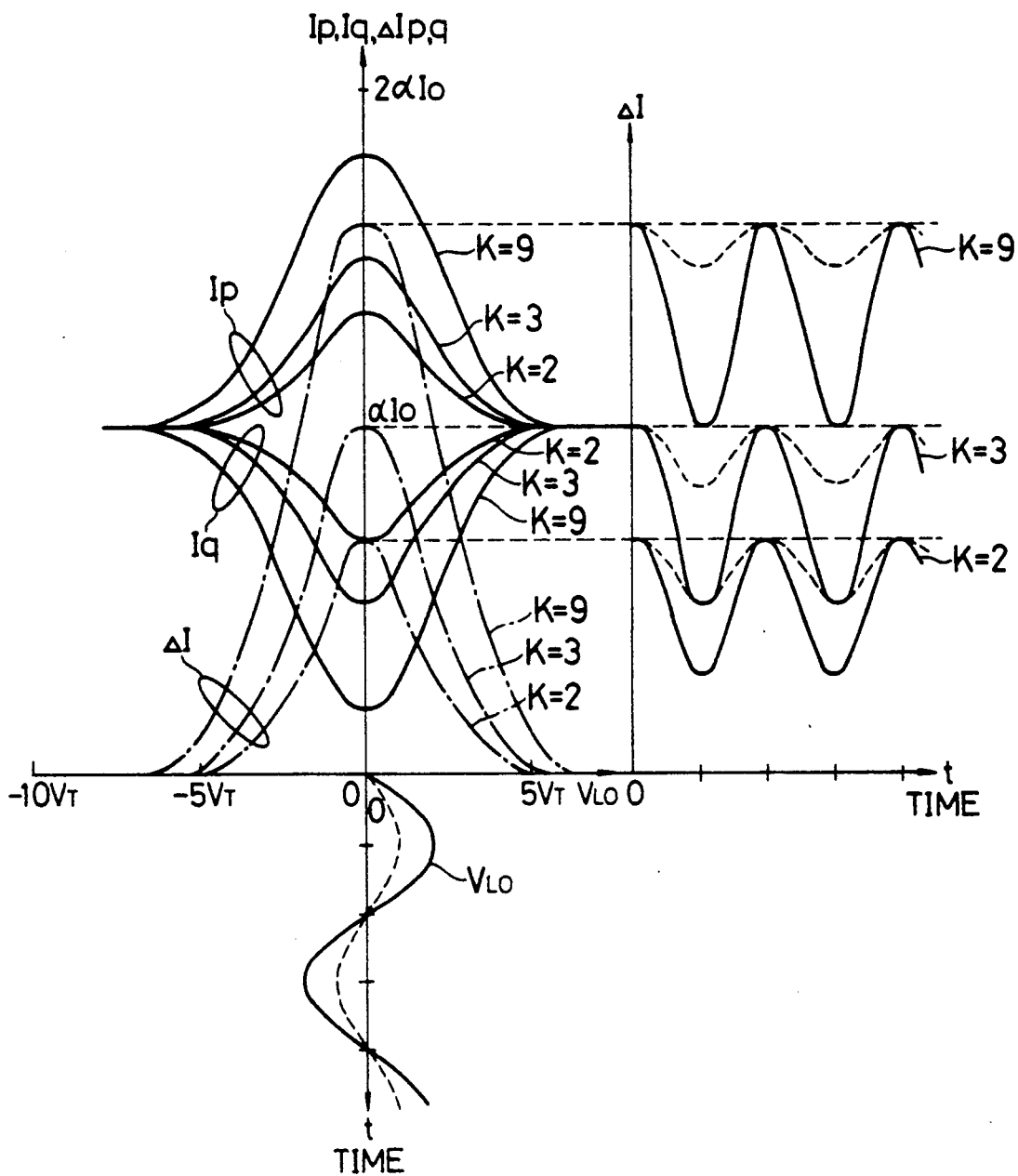
FIG. 3 is a diagram showing a characteristic of the circuit shown in FIG. 2.

Referring to FIG. 3, for example, when it was simulated with such parameters that were set as K=9, VLO=60 mV and fLO=1 kHz, the frequency component (fLO) of an input signal became a level of −60 dB or less on the output side as compared with the twofold frequency component (2 fLO) of the input signal, resulting in being obtainable as very good distortion factor property. As a result, no need to use filter results on the output side, so that the wide operating input frequency range can be obtained.

Next, the difference $\Delta$ Ip,q between the collector current sums Ip and Iq is substantially equal to a collector output current of the transistor Q8 through the current mirror circuit consisting of the transistors Q5, Q6, Q7 and Q8. This current becomes a driving current source of the differential amplifier consisting of the transistors Q11 and Q12 through the current mirror circuit consisting of the transistors Q9 and Q10. Accordingly, an output current IOUT of this differential amplifier can be expressed as follows;

$$IOUT = Ic11 - Ic12 = \alpha \Delta Ip,q \cdot \tanh(VIN/2VT) \quad (12)$$

where Ic11 and Ic12 are collector currents of the transistor power amplifying circuits Q11 and Q12, respectively.

Here, when $x \ll 1$, $\tanh x$ can be expanded in series as:

$$\tanh x = x - (x^3/3) + \quad (13)$$

so that if VIN is extremely smaller than 2VT, IOUT can be approximated as;

$$\begin{aligned} IOUT &= \alpha^2 \cdot I0 \cdot \{\tanh[(VLO + VK)/2VT] - \quad (14) \\ &\quad \tanh[(VLO - VK)/2VT]\} \times \tanh(VIN/2VT) \\ &= \alpha^2 \cdot I0 \cdot (\ln K)/4VT \cdot \{[1 - (\ln K)^2/12] - \\ &\quad (VLO)^2/4(VT)^2\} \times (1/2VT) \cdot \{VIN - [1/12(VT)^2] \cdot (VIN)^3\} \ldots \\ &= \alpha^2 \cdot I0 \cdot (\ln K)/8(VT)^2 \times \{[1 - (\ln K)^2/12] \cdot VIN - \\ &\quad (VLO)^2 \cdot (VIN)/4(VT)^2 - [1 - (\ln K)^2/12] \cdot (VIN)^3/12(VT)^2 + \\ &\quad (VLO)^2 \cdot (VIN)^3/48(VT)^4\} \end{aligned}$$

From Eq. (14), the product of $(VLO)^2$ and VIN, that is, $(VLO)^2 \cdot (VIN)$ can be obtained. By this product, the frequency component contained in the output current IOUT is predominated by (2 fLO+fIN) and (2 fLO−fIN) or (fIN−2 fLO). This is because the product of sin 2 A and sin B becomes the product of cos 2A and sin B, and the product of cos 2A and sin B becomes the sum of sin (2A+B) and sin (2A−B) or sin (B−2A). As a result, the circuit output IOUT is outputted having mixed the double wave signal of input signal VLO with the signal of VIN.

As explained above, the circuit shown in FIG. 2 comprises a frequency doubling circuit and mixing circuit of an input signal VLO, which are connected directly with each other through a current mirror circuit. In addition, by applying an output current of the frequency doubling circuit to a driving current source of the mixing circuit, a bias circuit of the mixing circuit does not need.

SECOND EMBODIMENT

Figure 4:
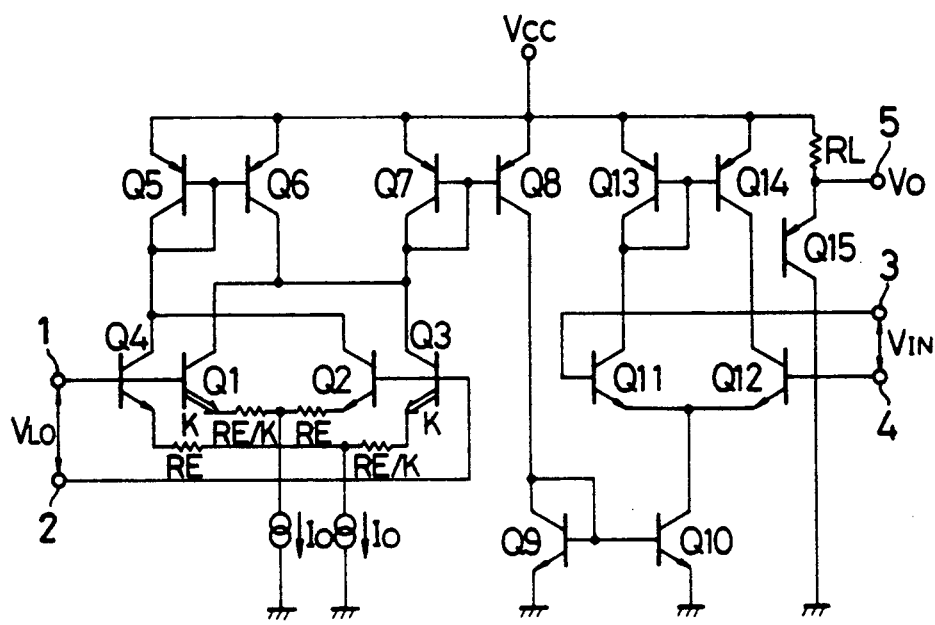
FIG. 4 is a circuit diagram of a frequency doubling and mixing circuit according to a second embodiment of this invention.
Figure 5:
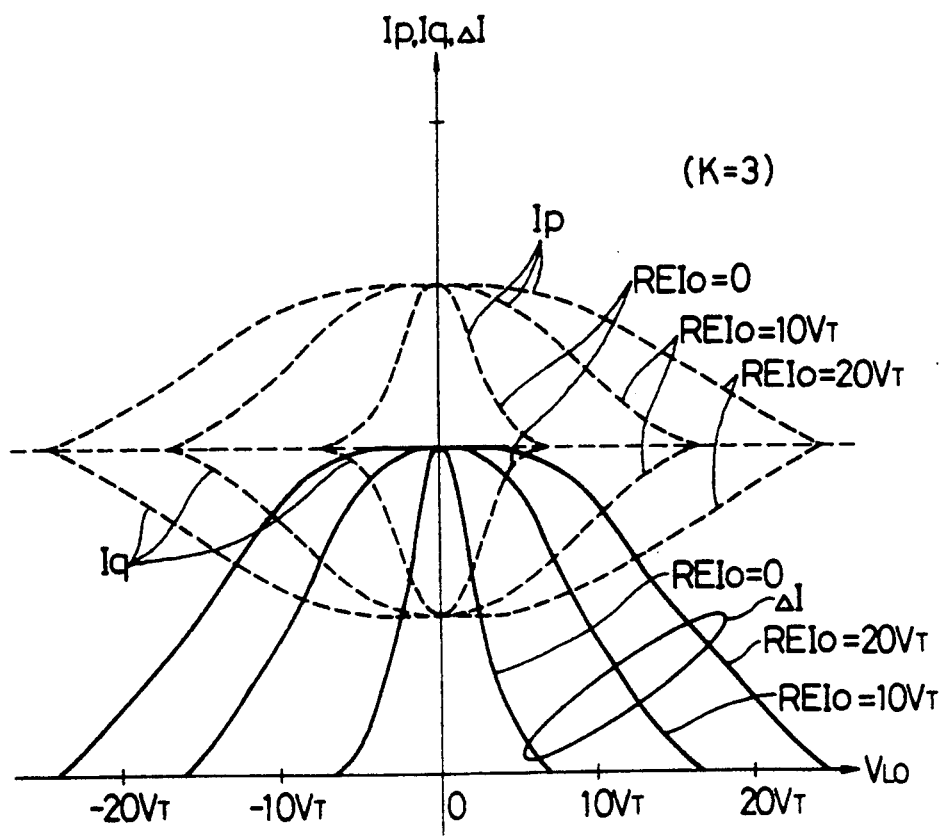
FIG. 5 is a diagram showing a characteristic of the circuit shown in FIG. 4.

FIG. 4 shows a second embodiment of this invention. In FIG. 4, the members having the same functions as those shown in FIG. 2 are expressed as the same reference numerals and letters. The circuit of this embodiment has resistors inserted directly into respective emitters of differential transistor-pairs Q1 to Q4. Referring to these emitter resistors, for example, in case of the transistors Q1 and Q2, the emitter ratio is K:1, and the emitter resistor of the transistor Q1 is made RE/K when the emitter resistor of the transistor Q2 is made RE. In the case of the transistors Q3 and Q4, the same selection manner as shown above is applied. FIG. 5 shows the characteristics obtained when the emitter resistors are inserted as above. As seen from FIG. 5, the amplitude level of the input signal VLO changes depending on the value of an emitter resistor to be inserted which means that the circuit of this embodiment can be used at any input signal level by appropriately selecting the value of the emitter resistor to be inserted.

As explained above, in the first and second embodiments, the frequency doubling circuit is connected directly to the mixing circuit using a current mirror circuit, so that a filter or the like does not need to be used, and expansion of frequency band and integration of circuit can be made easy. In addition, the distortion factor property of an output of the frequency doubling circuit is outstanding good, and at the same time, a bias circuit of the mixing circuit can be advantageously eliminated because these circuits are connected directly with each other by a current mirror circuit.

THIRD EMBODIMENT

Figure 6:
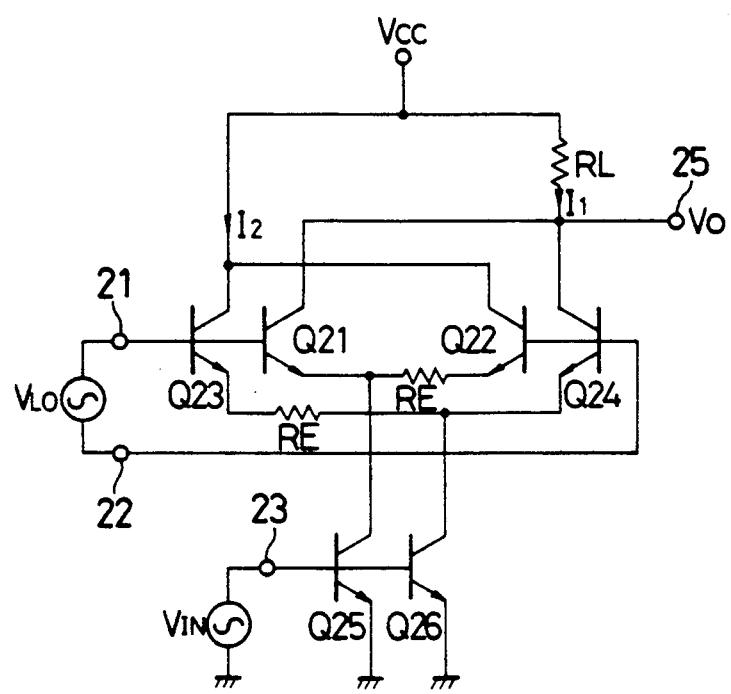
FIG. 6 is a circuit diagram of a frequency doubling and mixing circuit according to a third embodiment of this invention.

FIG. 6 is for explaining a third embodiment of this invention. In FIG. 6, 21 and 22 show a first input terminal-pair to be applied with an input signal VLO to be multiplied, 23 is a second input terminal, and an input signal VIN as a mixing signal is applied across the input terminal 23 and ground. In addition, Q 21 and Q22, and Q23 and Q24 are differential transistor-pairs which have respective emitters connected in common, in which each of the transistors Q22 and Q23 of respective differential transistor-pairs has an emitter resistor RE. Between these two sets of differential transistor-pairs, the collector of the transistors Q22 and Q23 each having an emitter resistor and the collector of transistors Q21 and Q24 each not having an emitter resistor are connected in common, the base of the transistor Q21 not having an emitter resistor and the base of the transistor Q23 having an emitter resistor are connected in common to the one input terminal 21 of the first input terminal pair, and the base of the transistor Q22 having an emitter resistor and the base of the transistor Q24 not having an emitter resistor are connected in common to the other input terminal 22 thereof. The collectors of the transistors Q21 and Q22 are connected directly to a power source VCC, the collector of the transistors Q21 and Q24 are connected to an output terminal 25 and at the same time, connected through a resistor RL to the power source VCC.

Transistors Q25 and Q26 respectively constitute known constant current sources, which are respectively connected to the emitters of the transistors Q21 and Q24 each not having an emitter resistor of said two sets of differential transistor-pair, and the bases of which are connected in common to the second input terminal 23.

With the circuit structured as above, if the base voltages of the differential transistor-pair Q21 and Q22 are respectively expressed as VBE 21 and VBE22, and the current amplification factor is expressed as $\alpha$, the following equation is established as;

$$VL0 + VBE21 + (Ic22/\alpha)RE - VBE\,22 = 0 \quad (15).$$

Here, if $VT = kT/q$, then, $VBE21 \gg VT$ and $VBE22 \gg VT$, and if the collector currents of the transistors Q21 and Q22 are respectively expressed as Ic21 and Ic22, and the saturation currents of the transistors Q21 and Q22 are respectively expressed as Is21 and Is22, then, there exist the following relations between VBE21, VBE22 and VT as;

$$VBE21 = VT \cdot \ln(Ic21/Is21) \quad (16)$$

$$VBE22 = VT \cdot \ln(Ic22/Is22) \quad (17).$$

In Eqs. (16) and (17), supposing that Is21 = Is22, Eq. (15) may be expressed as follows;

$$VL0 + VT \cdot \ln(Ic21/Ic22) + (Ic22/\alpha)RE = 0 \quad (18).$$

Between the collector current Ic25 of the transistor Q25, collector current Ic21 of the transistor Q21 and collector current Ic22 of the transistor Q22, there exists the following relation as;

$$\alpha \cdot Ic25 = Ic21 + Ic22 \quad (19).$$

Hence, Eq. (18) becomes as follows;

$$VL0 + VT \cdot \ln[(\alpha \cdot Ic25/Ic22) + 1] + (Ic22/\alpha)RE = 0 \quad (20).$$

Here, in order to obtain the gradient of the collector current Ic22 to the input voltage VL0 as a signal to be multiplied, by differentiating Ic22 with respect to VLO, the following can be obtained as;

$$\frac{d\,IC22}{d\,VLO} = -\frac{1}{VT\frac{Ic22(\alpha \cdot Ic25 - Ic22)}{\alpha \cdot Ic25} + \frac{RE}{\alpha}} \quad (21)$$

Here, the point where the differential value (absolute value) is maximized satisfies the following;

$$Ic22 = Ic21 = (\alpha \cdot Ic25)/2 \quad (22)$$

Hence, the maximum value is expressed by the following equation as;

$$\left|\frac{d\,Ic22}{d\,VLO}\right|_{Ic22=(1/2)\alpha \cdot Ic25} = \frac{\alpha \cdot Ic25}{4VT + RE \cdot Ic25} \quad (23)$$

In this case, the input voltage VLO becomes as follows;

$$VLO = -(\tfrac{1}{2})RE \cdot Ic25 \quad (24).$$

In this case of referring to the differential transistor-pair consisting of the transistors Q23 and Q24, it can be determined in the same manner as above. That is, the derivation may be achieved by inverting the polarity of the input voltage VLO in the above-mentioned method of derivation, and it is omitted to be shown here.

Next, if the transistors Q25 and Q26 each has a saturation current of Is, the collector currents Ic25 and Ic26 thereof are given as;

$$Ic25 = Ic26 \approx Is \,[\exp(VIN/VT) - 1] \quad (25)$$
$$\approx Is \cdot \exp(VIN/VT)$$

Then, if VF is a constant voltage value, VRF is an AC signal value and an input signal voltage VIN as a mixing signal is expressed as $$VIN = VF + VRF \quad (26)$$

Eq. (25) becomes as follows;

$$Ic25 = Ic26 = Is \cdot \exp[(VF + VRF)/VT] \quad (27)$$
$$\approx I0 \cdot \exp(VRF/VT)$$

where, $I0 = Is \cdot \exp(VF/VT)$ \quad (28)

As a result, the DC values of the collector currents Ic25 and Ic26 become as follows;

$$Ic25 = Ic26 = I0 \quad (29).$$

Figure 7:
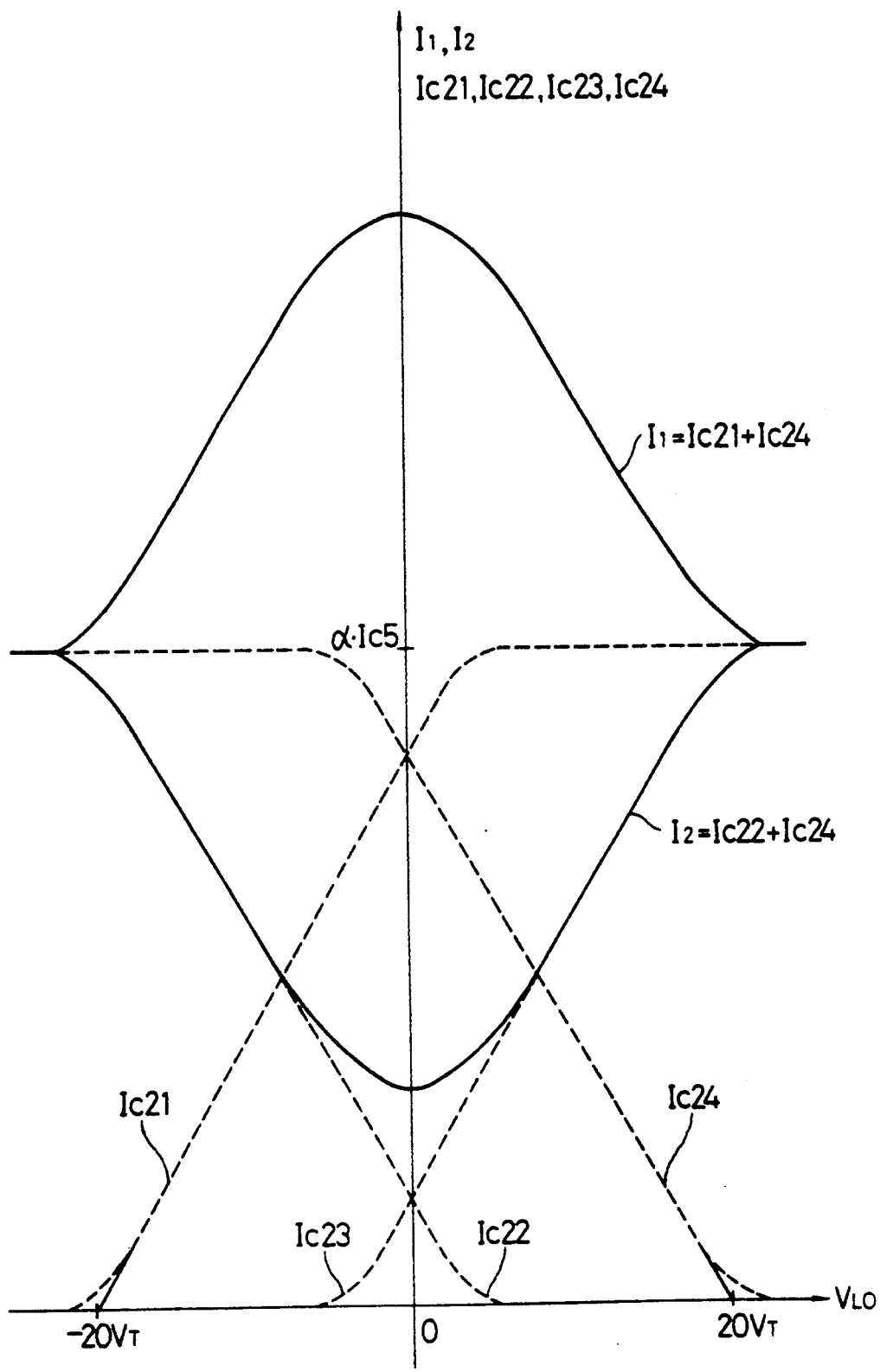
FIG. 7 is a diagram showing a characteristic of the circuit shown in FIG. 6.

FIG. 7 shows a relation of the input voltage VLO and each of the collector currents Ic21, Ic22, Ic23 and Ic24 of respective transistors Q21, Q22, Q23 and Q24 when VRF=0. In addition, RE.Ic25=16 VT is supposed. In FIG. 7, I1 is the sum of the collector current Ic21 of the transistor Q21 and the collector current Ic24 of the transistor Q24, and I2 is the sum of the collector current Ic22 of the transistor Q22 and the collector current Ic23 of the transistor Q23, that is, $$I1 = Ic21 + Ic24 \quad (30)$$

$$I2 = Ic22 + Ic23 \quad (31).$$

In this case, it is found that each of the currents I1 and I2 becomes a differential current and has a both wave rectification property for the input voltage VLO. As a result, by appropriately selecting the emitter resistor RE, such a characteristic can be obtained for each of the currents I1 and I2 that is considerably approximated to the square characteristic of the input voltage VLO, which means that a double frequency 2 fLO is resulted as compared with the input frequency fLO, and it becomes predominant as the frequency component thereof. Also, when each of the currents I1 and I2 has the square characteristic closely with respect to the input voltage VLO, all the frequency components thereof become the 2 fLO component only. In addition, from FIG. 7, it is found that each of the currents I1 and I2 is proportional to the collector current Ic25 of the transistor Q25.

Next, explanations will be made below on the mixing operation. Supposing that a, b and c are respectively constants and the difference I1,2 between the currents I1 and I2 is approximated as;

$$\Delta I1,2 = I1 - I2 \quad (32)$$
$$\approx a \cdot Ic25 \cdot (a - b \cdot VLO^2 - c \cdot VLO^4),$$

the following equation can be obtained as;

$$\Delta I1,2 = a \cdot I0 \cdot \exp(VRF/VT) \times (a - b \cdot VLO^2 - c \cdot VLO^4) \quad (33).$$

By expanding the logarithmic function of Eq. (33) in series, the following equation can be obtained as;

$$\Delta I1,2 \approx a \cdot [1 + (VRF/VT) + (1/2)(VRF/VT)^2 + \ldots] \times \quad (34)$$
$$(a - b \cdot VLO^2 - c \cdot VLO^4)$$
$$\approx a \cdot [1 + (VRF/VT)] \times (a - b \cdot VLO^2 - c \cdot VLO^4)$$
$$= a \cdot b \cdot (I0/VT) \cdot VRF \cdot VLO^2 + a \cdot a \cdot I0 +$$
$$a \cdot b \cdot I0 \cdot VLO^2 + a \cdot c \cdot I0 \cdot VLO^2 + (a \cdot a \cdot I0/VT) \cdot VRF +$$
$$(a \cdot c \cdot I0/VT) \cdot VRF \cdot VLO^4$$

Referring to Eq. (34), the product of $(VLO)^2$ and VRF, or $(VLO)^2 \cdot VRF$ is included. Accordingly, the frequency component contained in the differential current $\Delta I1,2$ is (2fLO+fRF) and (2fLO−fRF) or (fRF−2 fLO). The current $\Delta I1,2$ is a differential output between the currents I1 and I2, so that the same frequency component as shown above is contained into each of the currents I1 and I2 as well.

As explained above, according to the circuit shown in FIG. 6, a double frequency signal of the input voltage VLO and a signal of the AC signal VRF are mixed to be outputted, so that it is found that the circuit shown in FIG. 6 constitutes a frequency doubling and mixing circuit.

FOURTH EMBODIMENT

Figure 8:
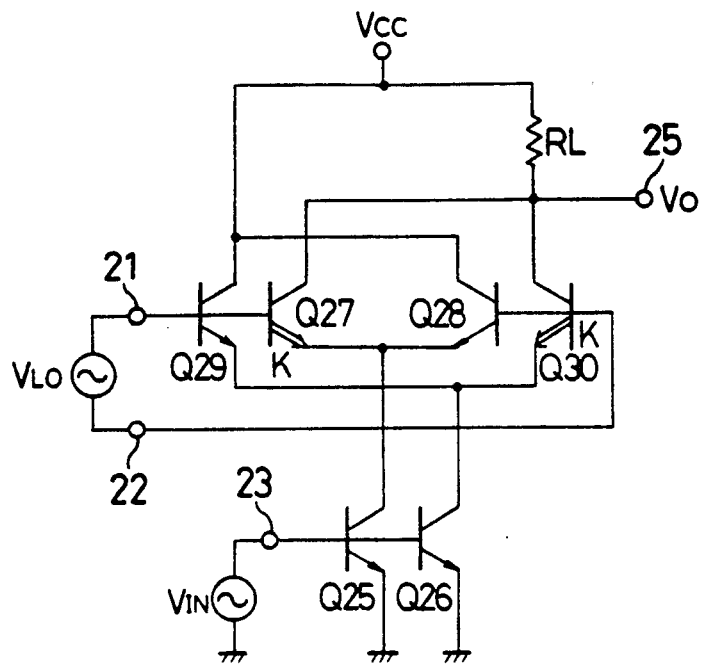
FIG. 8 is a circuit diagram of a frequency doubling and mixing circuit according to a fourth embodiment of this invention.

FIG. 8 shows a fourth embodiment of this invention, in which transistor-pair Q27 and Q28 and transistor-pair Q29 and Q30 are differential transistor-pairs which respectively have emitters connected in common. The emitter size of the transistor-pair Q28 and Q29 is made 1, the emitter size of the corresponding transistor-pair Q27 and Q30 is made K (K>1). Between these two sets of differential transistor-pairs, the collector of the transistors Q27 and Q30, and that of the transistors Q28 and Q29, which are respectively equal in emitter size, are connected in common, the base of the transistor Q27 and that of the transistor Q29, which are different in emitter size, are connected in common in one input terminal 21, and the base of the transistor Q28 and that of the transistor Q30, which are different in emitter size, are connected in common to the other input terminal 22. The collectors of the transistors Q28 and Q29 are connected directly to a power source VCC, and the collectors of the transistors Q27 and Q30 are connected to an output terminal 25 and at the same time, to the power source VCC through a resistor RL. Transistors Q25 and Q26 respectively constitute known constant current sources similar to the third embodiment.

With the structure as above, the collector currents Ic27, Ic28, Ic29, Ic30, Ic25 and Ic26 of respective transistors Q27, Q28, Q29, Q30, Q25 and Q26 become as follows;

$$Ic27 = \frac{a \cdot Ic25}{1 + (1/K) \cdot \exp(-VLO/VT)} \quad (35)$$

$$Ic28 = \frac{\alpha \cdot Ic25}{1 + K \cdot \exp(-VLO/VT)} \quad (36)$$

$$Ic29 = \frac{\alpha \cdot Ic26}{1 + (1/K) \cdot \exp(-VLO/VT)} \quad (37)$$

$$Ic30 = \frac{\alpha \cdot Ic26}{1 + K \cdot \exp(-VLO/VT)} \quad (38)$$

$$Ic25 = Ic26 = Is \cdot \exp(-VIN/VT) \quad (39)$$

In Eqs. (35) to (39), supposing that $\exp(-VLO/VT) \gg 1$ and $(VIN/VT) \gg 1$, approximations are made as follows;

$$\exp(VLO/VT) - 1 \approx \exp(VLO/VT) \quad (40)$$

$$\exp(VIN/VT) - 1 \approx \exp(VIN/VT) \quad (41)$$

As a result, the sum Ip1 of the collector currents Ic27 and Ic30 and the sum Iq1 of the collector currents Ic28 and Ic29 can be expressed as follows;

$$\begin{aligned} Ip1 &= Ic27 + Ic30 \\ &= \alpha \cdot Is \cdot \exp(-VIN/VT) \\ &\times \frac{1}{1 + (1/K)\exp(-VLO/VT)} + \frac{1}{1 + (1/K)\exp(VLO/VT)} \end{aligned} \quad (42)$$

$$\begin{aligned} Iq1 &= Ic28 + Ic29 \\ &= \alpha \cdot Is \cdot \exp(VIN/VT) \\ &\times \frac{1}{1 + K \cdot \exp(-VLO/VT)} + \frac{1}{1 + K \cdot \exp(VLO/VT)} \end{aligned} \quad (43)$$

Accordingly, the difference $\Delta Ip1,q1$ between the sums Ip1 and Iq1 can be obtained as;

$$\begin{aligned} \Delta Ip1,q1 &= Ip1 - Iq1 \\ &= \alpha \cdot Is \cdot \exp(VIN/VT) \times \\ & \{\tanh[(VLO + VK)/2VT] - \tanh[(VLO - VK)/2VT]\} \end{aligned} \quad (44)$$

Here, K is constant, and the current difference $\Delta Ip1,q1$ is an even function with respect to VLO. In addition, $\exp(\pm x)$ can be shown as;

$$\exp(\pm x) = \sum_{n=0}^{\infty} (\pm 1)^n \frac{X^n}{n!} \quad (45)$$

When $x \ll 1$, $\tan h\, x$ can be expanded in series as;

$$\tan h\, x = x - (x^3/3) + \quad (46)$$

the current difference $\Delta Ip1,q1$ can be transformed as;

$$\begin{aligned} \Delta Ip1,q1 &= \frac{2\alpha \cdot Is \cdot \exp(VIN/VT) \cdot [k - (1/k)]}{[k + (1/k)] + 2 +} \\ & (VLO/VT)^2 + (1/12)(-VLO/VT)^4 + \cdots \\ &= \alpha \cdot Is \cdot \exp(VIN/VT) \times \\ & (1nK) \cdot \{[1 - (1nK)^2/12] - (VLO)^2/4VT\} \end{aligned} \quad (47)$$

As a result, the current difference $\Delta Ip1,q1$ can be approximated as follows;

$$\Delta Ip1,q1 \approx \alpha \cdot Is \cdot \exp(VIN/VT) \times \quad (48)$$
$$(1nK) \cdot \{[1 - (1nK)^2/12] - (VLO)^2/4VT\}$$

As seen from Eq. (48), the current difference $\Delta Ip1,q1$ can be approximated by an equation having the term of the square of VLO as the input signal, so that almost of the frequency components contained into the current difference Ip1, q1, as compared with the input signal frequency of fLO, have a frequency of 2 fLO when the DC component is removed therefrom. As a result, in this embodiment, it can be found that such a frequency multiplying operation that is effected in the third embodiment is carried out.

Next, if the input signal VIN is set as below according to EQ. (26) similarly to the third embodiment;

$$VIN = VF + VRF,$$

Eq. (48) becomes below.

$$\Delta Ip1,q1 \approx \alpha \cdot I0 \cdot \exp(VRF/VT) \times \quad (49)$$
$$(1nK) \cdot \{[1 - (1nK)^2/12] - (VLO)^2/4VT\}$$

where IO is equal to that shown in Eq. (27).

And approximating Eq. (49) by expanding the logarithmic function of Eq. (49) in accordance with Eq. (8) with an assumption of $VRF \ll VT$, the following can be obtained as;

$$\begin{aligned} \Delta Ip1,q1 &\approx \alpha \cdot I0 \cdot (1nK) \cdot \{[1 - (1nK)^2/12] - (VLO)^2/4VT\} \times \\ & [1 + (VRF/VT) + (1/2)(VRF/VT)^2 + \ldots] \\ &= \alpha \cdot I0 \cdot (1nK) \times \{[1 - (1nK)^2/12] - (VLO)^2/4VT + \\ & [1 - (1nK)^2/12] \cdot (VRF/VT) - \\ & [1/4(VT)^3] \cdot (VLO \cdot VRF) + \ldots]\} \end{aligned} \quad (50)$$

According to Eq. (50), the current difference $\Delta Ip1,q1$ contains the product of $(VLO)^2$ and VRF, or $(VLO)^2 \cdot VRF$, so that in the fourth embodiment shown in FIG. 8, a frequency doubling and mixing circuit can be provided that a double frequency signal of the input signal VLO and the input signal VRF are mixed to be outputted.

FIFTH EMBODIMENT

Figure 9:
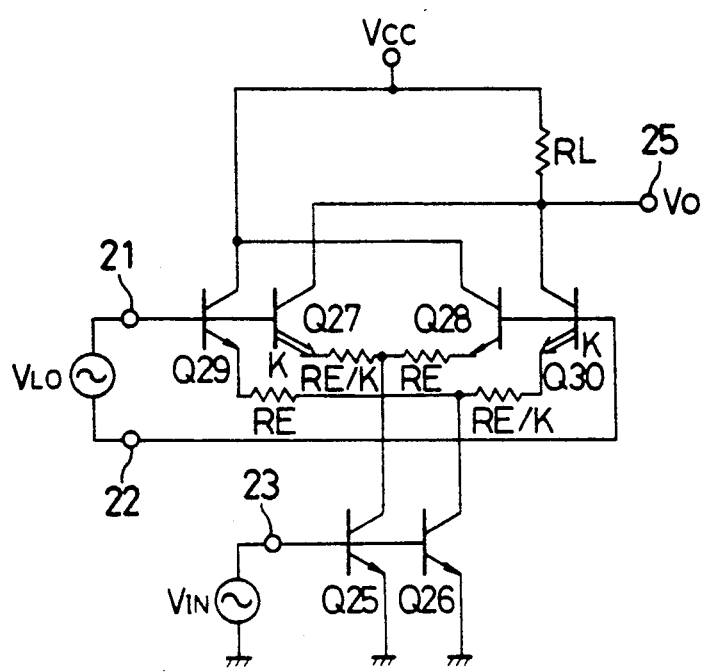
FIG. 9 is a circuit diagram of a frequency doubling and mixing circuit according to a fifth embodiment of this invention.

As shown in FIG. 9, an emitter resistor with a value of RE/K is inserted into an emitter of each of transistors Q27 and Q30 large in emitter size, and an emitter resistor with a value of RE is inserted into an emitter of each of transistors Q28 and Q29 small in emitter size, so that the amplitude level of an input signal VLO can be enhanced. As a result, by appropriately selecting the resistor value of an emitter resistor, the input signal VLO can be applied at any amplitude level.

As explained above, in the third to fifth embodiments of this invention, the circuit has two differential transistor-pairs having emitter resistors in one transistor of each pair or different emitter sizes, and two transistors respectively providing constant current sources to these two differential transistor-pairs, so that the frequency doubling and mixing operations can be simultaneously carried out, which means that such a circuit can be practically realized with a small number of elements to be used, thus resulting in reductions of the circuit scale and power consumption.

SIXTH EMBODIMENT

Figure 10:
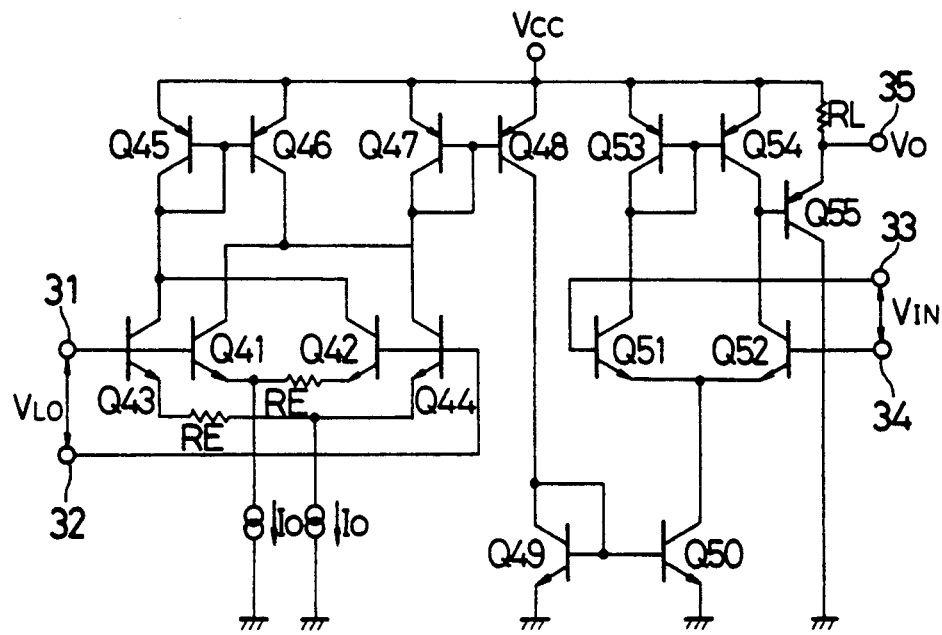
FIG. 10 is a circuit diagram of a frequency doubling and mixing circuit according to a sixth embodiment of this invention.

FIG. 10 shows a sixth embodiment of this invention, in which 31 and 32 constitute a first input terminal pair to be applied with a local signal (voltage VLO) to be doubled, 33 and 34 constitute a second input terminal pair to be applied with a mixing signal (voltage VIN), and Q41 and Q42, Q43 and Q44 are differential transistor-pairs whose emitters are respectively voltage-connected with each other. The transistors Q42 and Q43 only of respective differential transistor pairs are provided with emitter resistors RE. These two differential transistor-pairs constitute a first differential amplifier. In these two pairs the collector of the transistors Q42 and Q43 each having an emitter resistor and that of the transistors Q41 and Q44 each not having an emitter resistor are respectively connected in common, the base of the transistor Q41 not having an emitter resistor and that of the transistor Q43 having an emitter resistor are connected to one input terminal 31 of the first input terminal-pair, and yet the base of the transistor Q42 having an emitter resistor and that of transistor Q44 not having an emitter resistor are connected in common to the other input terminal 32 of the first input terminal-pair. The emitter of each of these two differential transistor-pairs is connected to constant current source IO.

Then, transistors Q51 and Q52 constitute a second differential amplifier. The base of the transistor Q51 is connected to the input terminal 33 of the second input terminal-pair, the base of the transistor Q52 is connected to the input terminal 34 of the second input terminal-pair. The transistors Q45 and Q46, Q47 and Q48, and Q49 and Q50 respectively constitute a first current mirror circuit and a second current mirror circuit and a third current mirror circuit. Said first and second differential amplifiers are directly connected to each other by the first and second current mirror circuits. VCC is a power source voltage, RL is a load resistance, and 35 is an output terminal from which the mixing output (voltage VO) is taken out.

Next, the operational principle of the circuit structured as above will be explained below. In the first differential amplifier, between the base voltages VB41 and VB42 of respective differential transistor-pair Q41 and Q42, the collector current Ic42 of the transistor Q42 and the current amplification factor $\alpha$, the following is established as;

$$VLO + VB41 + (Ic42/\alpha)RE - VB42 = 0 \quad (51)$$

Also, $VB41 >> VT$ and $VB42 >> VT$, so that if the collector current of the transistor Q41 is expressed as Ic41 and the saturation currents of the differential transistor-pair Q41 and Q42 are respectively expressed as Is41 and Is42, there exists the following relation between VB41, VB42 and VT as;

$$VB41 = VT \cdot \ln(Ic41/Is41) \quad (52)$$

$$VB42 = VT \cdot \ln(Ic42/Is42) \quad (53)$$

Here, supposing as $Is41 = Is42$, Eq. (51) can be shown as follows;

$$VLO + VT \cdot \ln(Ic41/Ic42) + (Ic42/\alpha)RE = 0 \quad (54)$$

Also, there exists the following relation between the constant current source IO and the collector currents Ic41 and Ic42 as;

$$\alpha \cdot IO = Ic41 + Ic42 \quad (55)$$

Hence, Eq. (54) can be made as follows;
$$VLO + VT \cdot \ln[(\alpha \cdot IO/Ic42) + 1] + (Ic42/\alpha)RE = 0 \quad (56)$$

Here, in order to obtain the gradient of the collector current Ic42 with respect to the local signal (voltage VLO) as a signal to be doubled, Ic42 is differentiated with respect to VLO as follows;

$$\frac{d\,Ic42}{d\,VLO} = \frac{1}{VT \cdot \frac{Ic42\,(\alpha \cdot IO - Ic42)}{\alpha \cdot IO} + \frac{RE}{\alpha}} \quad (57)$$

The point where the differentiating value (absolute value) is maximized is obtained when the following is satisfied as;

$$Ic42 = Ic41 = (\alpha \cdot IO/2) \quad (58)$$

Thus, the value of such point can be shown by the following equation;

$$\left| \frac{d\,Ic42}{d\,VLO} \right|_{Ic42=(\alpha \cdot IO/2)} = \frac{\alpha \cdot IO}{4VT + RE \cdot IO} \quad (59)$$

The input voltage VLO in this case can be obtained as;

$$VLO = -(\tfrac{1}{2}) RE \cdot Ic45 \quad (60)$$

Figure 11:
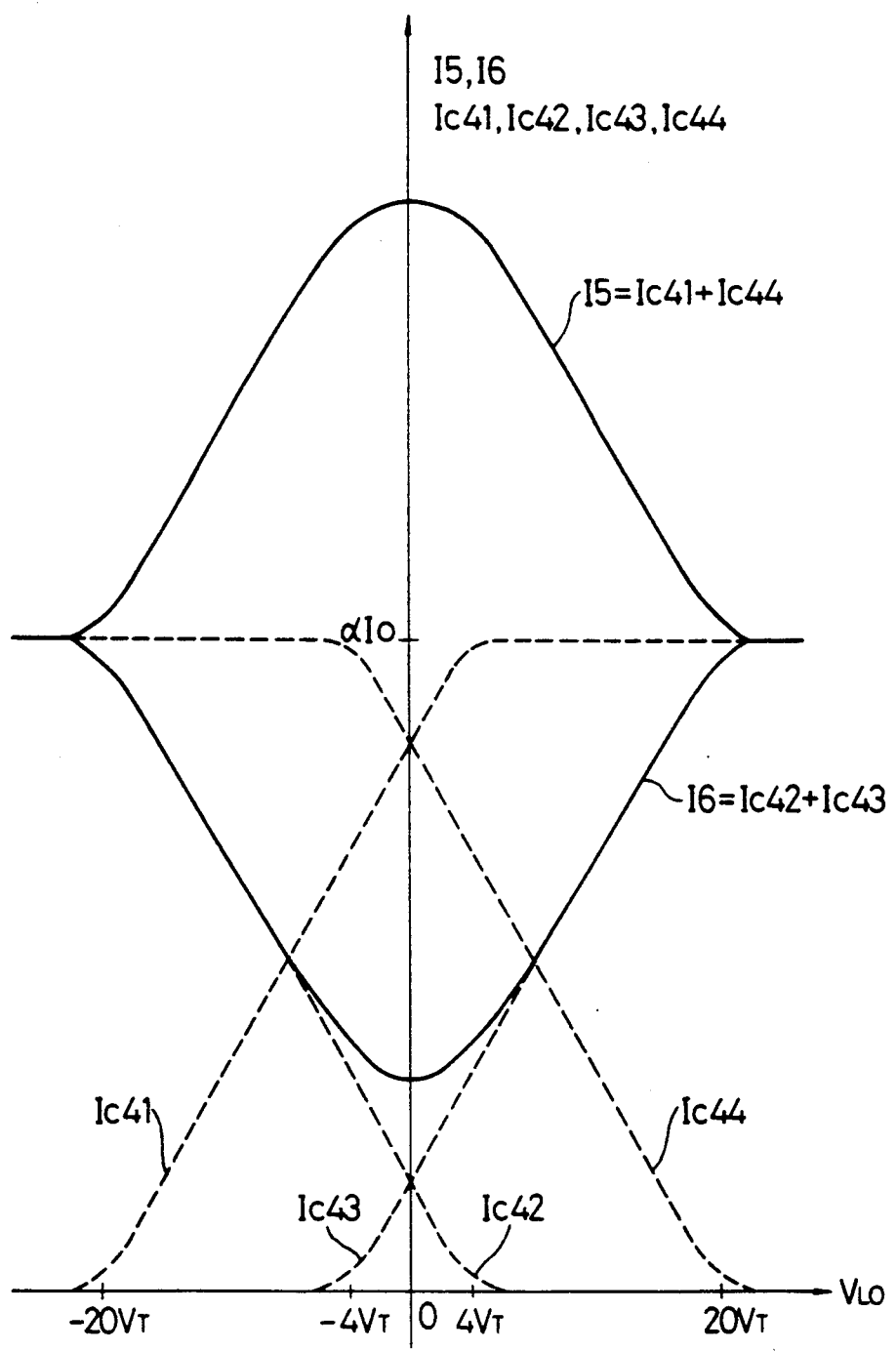
FIG. 11 shows a relation of a collector current and an input signal (voltage) VLO of the circuit shown in FIG. 9.

In the differential transistor-pair consisting of the transistors Q43 and Q44, the determinations can be made in the same manner as shown above. The derivation can be achieved by inverting the polarity of the input voltage VLO, thus being omitted here. Between the collector currents Ic41, Ic42, Ic43 and Ic44 of respective transistors determined as above and the input voltage VLO, there exist the relations as shown in FIG. 11. FIG. 11 shows the case of being $RE \cdot IO = 16\,VT$.

As seen from FIG. 11, the tangent at the point where the gradient is maximized has a point of being $VLO = 4\,VT$ as the starting point and passes through points of being $VLO = -(\tfrac{1}{2})\,RE \cdot IO$ and $Ic42 = (\tfrac{1}{2})\,\alpha \cdot IO$. In this case, the starting point of 4 VT is made constant independently of the value of emitter resistor RE and that of constant current source IO.

Here, I5 and I6 are defined as follows;

$$I5 = Ic41 + Ic44 \quad (61)$$

$$I6 = Ic42 + Ic43 \quad (62)$$

Then, it is found that each of the currents I5 and I6 is a differential current and has a both wave rectification property for the input voltage VLO. As a result, by optimizing the value of the emitter resistance and that of the constant current source IO, each of the currents I5 and I6 can be considerably approximated in characteristic to the square characteristic of the input voltage VLO. That is, this first differential amplifier constitutes a frequency doubling circuit, and each of the currents I5 and I6 is an even function with respect to the input voltage VLO, so that even if approximation is made up to the fourth term of the input voltage VLO as the primary approximation of each of the currents I5 and I6, it can be expected that an error to be generated is small. Therefore, the current difference I5,6 between the currents I5 and I6 can be approximated with a, b and c each as a constant as follows;

$$\Delta I5,6 = I5 - I6 \quad (63)$$
$$\approx \alpha \cdot IO \cdot (a - b \cdot VLO^2 - c \cdot VLO^4)$$

This current difference I5,6 is generated by the first and second current mirror circuits respectively consisting of the transistors Q45 and Q46 and the transistors Q47 and Q48. And, an electric current substantially equal to this current difference I5,6 is flowed to the collector of the transistor Q48, and this electric current becomes a control current of the third current mirror circuit consisting of the transistors Q49 and Q50. If the collector currents of the transistors Q51 and Q52 are expressed as Ic51 and Ic52, respectively, the difference therebetween, or the output current I OUT of the second differential amplifier can be shown as follows;

$$I\text{ OUT} = Ic51 - Ic52 \tag{64}$$
$$= \alpha \cdot I5,6 \cdot \tanh(VIN/2VT)$$

Here, with VIN<<2VT, tanh(VIN/2VT) is expanded in series according to Eq. (13), and further Eq. (63) is substituted for I5,6. Thus, the output current I OUT can be approximated as follows;

$$I\text{ OUT} \approx \alpha^2 \cdot I0 \, (a - b \cdot VLO^2 - c \cdot VLO^4) \times \tag{65}$$
$$\{(VIN/2VT) - (1/3)(VIN/2VT)^3\}$$

Eq. (65) can be further expanded as follows;

$$I\text{ OUT} = [(\alpha^2 \cdot I0 \cdot a)/(2VT)]VIN - \tag{66}$$
$$[(\alpha^2 \cdot I0 \cdot a)(24VT^3)]VIN^3 - [(\alpha^2 \cdot I0 \cdot b)/(2VT)]VIN \cdot VLO^2 +$$
$$[(\alpha^2 \cdot I0 \cdot b)/(24VT^3)]VLO^2 \cdot VIN^3 -$$
$$[(\alpha^2 \cdot I0 \cdot c)/(2VT)]VIN \cdot VLO^4 +$$
$$[(\alpha^2 \cdot I0 \cdot c)/(24VT^3)]VIN^3 \cdot VLO^4$$

Eq. (66) contains the product (VLO)².VIN of (VLO)² and VIN, so that it is found that the output current IOUT contains frequency components of (2 fLO+fIN) and (2 fLO−fIN) or (2 fIN−2 fLO). In fact, if a<<b, and c<<b, these frequency components become predominant. As a result, from the output terminal 35 is outputted by mixing the double frequency of the input signal VLO with the input signal VIN, which means that this second differential amplifier becomes a mixing circuit.

As explained above, the circuit shown in FIG. 10 makes it possible to effect the frequency doubling operation of the input signal VLO and the mixing operation of the signal thus frequency-multiplied with the input signal VIN by one unit of circuit. In addition, the frequency doubling circuit and the mixing circuit are connected directly with each other through a current mirror circuit, and an output current of the frequency doubling circuit is used as the driving current of the mixing circuit, so that a bias circuit of the mixing circuit can be eliminated, being adapted to be formed into semiconductor integrated circuit. It is needless to say that a filter to be equipped outside does not need, making possible to widen the frequency band to be applied.

SEVENTH EMBODIMENT

Figure 12:
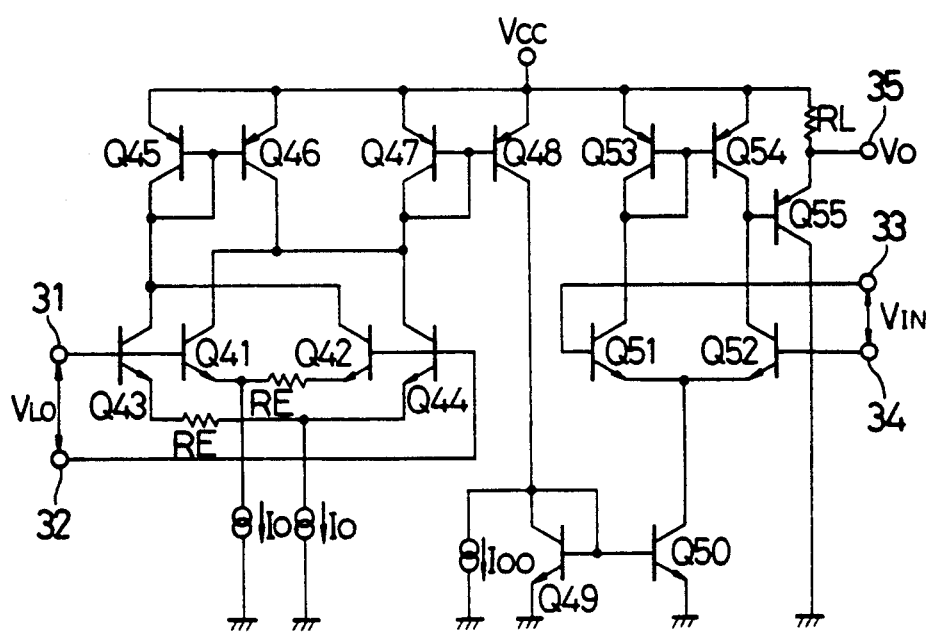
FIG. 12 is a circuit diagram of a frequency doubling and mixing circuit according to a seventh embodiment of this invention.

FIG. 12 is for explaining a seventh embodiment of this invention. In this embodiment, an constant current source I00 is inserted in parallel in the transistor Q49 of the third current mirror circuit as the driving source of the second differential amplifier shown in the sixth embodiment thereby to enhance the conversion gain of the mixing circuit.

In the third current mirror circuit consisting of the transistors Q49 and Q50, a current obtained by subtracting a constant DC value I00 of the constant current source (I00) from the output of the current mirror circuit of the preceding stage (ΔI5,6 shown by Eq. (63)) is made as the driving current of the second differential amplifier (mixing circuit), so that if it is expressed as I', Eq. (63) already shown above can be given as follows in this embodiment;

$$\Delta I' = I1 - I2 - I00 \tag{67}$$
$$\approx \alpha \cdot I0 \cdot (a' - b \cdot VLO^2 - c \cdot VLO^4)$$

Provided, in Eq. (67), between the constant current sources I00 and I0, there exists the following relation as;

$$I00 = (a - a')\alpha.I0 \tag{68}$$

As a result, by substituting a of Eqs. (65) and (66) with a', the output current I00' of the mixing circuit can be given as follows;

$$I'\text{ OUT} = Ic51 - Ic52 \tag{69}$$
$$\approx \alpha^2 \cdot I0 \cdot (a' - b \cdot VLO^2 - c \cdot VLO^4) \times$$
$$\{(VIn/2VT) - (1/3)(VIN/2VT)^3\}$$

$$I'\text{ OUT} = [(\alpha^2 \cdot I0 \cdot a')/(2VT)]VIN - \tag{70}$$
$$[(\alpha^2 \cdot I0 \cdot a')(24VT^3)]VIN^3 - [(\alpha^2 \cdot I0 \cdot b)/(2VT)]VIN \cdot VLO^2 +$$
$$[(\alpha^2 \cdot I0 \cdot b)/(24VT^3)]VLO^2 \cdot VIN^3 -$$
$$[(\alpha^2 \cdot I0 \cdot c)/(2VT)]VIN \cdot VLO^4 +$$
$$[(\alpha^2 \cdot I0 \cdot c)/(24VT^3)]VIN^3 \cdot VLO^4$$

Here, a>a', so that the proportion of the product (VLO)².VIN contained into the output current I00' becomes larger by an amount that the proportions of VIN and (VLO)² are reduced than the product (VLO)².VIN contained into the output current I00. This means that the conversion gain of the mixing circuit can be inhanced. In addition, it is needless to say that the circuit subtracting the constant DC value from the current difference ΔI5,6 is not limited to the circuit shown in FIG. 12.

As explained above, in the sixth and seventh embodiments, the first differential amplifier constitutes a frequency doubling circuit, and the second differential amplifier constitutes a mixing circuit. The frequency doubling circuit and mixing circuit thus constituted are connected directly with each other through a current mirror circuit, so that the frequency doubling operation of a signal to be multiplied and the mixing operation of the signal thus frequency-doubled with a mixing signal can be achieved by one unit of circuit.

In addition, in the seventh embodiment, a constant direct current is subtracted from each of output currents of the first differential amplifier as the frequency doubling circuit thereby to drive the second differential amplifier as the mixing circuit, so that the conversion gain of the mixing circuit can be improved.

What is claimed is:

1. A frequency doubling and mixing circuit comprising;
   a first differential transistor-pair comprising a first and second transistor each having an emitter, base and collector, said emitters of said first and second transistors being coupled in common and having relative emitter sizes of K and 1, respectively, wherein K is larger than 1;

a second differential transistor-pair comprising a third and fourth transistor each having an emitter, base and collector, said emitters of said third and fourth transistors being coupled in common and having relative emitter sizes of K and 1, respectively;

a first constant current source for supplying a constant current to said first differential transistor-pair;

a second constant current source for supplying a constant current to said second differential transistor-pair;

said bases of said first and fourth transistors being coupled together;

said bases of said second and third transistors being coupled together;

said collectors of said first and third transistors being coupled together to provide a first output;

said collectors of said second and fourth transistors being coupled together to provide a second output;

means for deriving a differential current between said first and second outputs; and a differential amplifying circuit being driven by said differential current and having an input and an output;

wherein a signal whose frequency is to be doubled is supplied across said commonly coupled bases, a mixing signal is supplied to said input of said differential amplifying circuit, and a circuit output is provided at said output of said differential amplifying circuit.

2. A frequency doubling and mixing circuit as claimed in claim 1, wherein said means for deriving a differential current comprises a current mirror circuit coupled to said first and second differential transistor-pairs.

3. A frequency doubling and mixing circuit as claimed in claim 1, wherein a resistor is coupled in series to each of said emitters of said first and second transistors, and to each of said emitters of said third and fourth transistors.

4. A frequency doubling and mixing circuit as claimed in claim 3, wherein said means for deriving a differential current comprises a current mirror circuit coupled to said first and second differential transistor-pairs.

5. A frequency doubling and mixing circuit as claimed in claim 3, wherein:

said means for deriving a differential current comprises a first current mirror circuit coupled to said first and second differential transistor-pairs for deriving a first differential current; and said frequency doubling and mixing circuit further comprises a second current mirror circuit coupled to said first current mirror circuit;

said first current mirror circuit provides said first differential current to said second current mirror circuit which provides, in accordance therewith, said differential current to said differential amplifying circuit.

6. A frequency doubling and mixing circuit as claimed in claim 5, further comprising a third current mirror circuit, coupled to said differential amplifying circuit and acting as a load of said differential amplifying circuit to cause said differential amplifying circuit to provide said circuit output signal.

7. A frequency doubling and mixing circuit as claimed in claim 3, wherein said resistors coupled to said emitters of said second and fourth transistors each have a resistance value K times larger than a resistance value of each of said resistors coupled to said emitters of said first and third transistors.

8. A frequency doubling and mixing circuit as claimed in claim 7, wherein said means for deriving a differential current comprises a current mirror circuit coupled to said first and second differential transistor-pairs.

9. A frequency doubling and mixing circuit as claimed in claim 7, wherein:

said means for deriving a differential current comprises a first current mirror circuit coupled to said first and second differential transistor-pairs for deriving a first differential current; and said frequency doubling and mixing circuit further comprises a second current mirror circuit coupled to said first current mirror circuit;

said first current mirror circuit provides said first differential current to said second current mirror circuit which provides, in accordance therewith, said differential current to said differential amplifying circuit.

10. A frequency doubling and mixing circuit as claimed in claim 9, further comprising a third current mirror circuit, coupled to said differential amplifying circuit and acting as a load of said differential amplifying circuit to cause said differential amplifying circuit to provide said circuit output signal.

11. A frequency doubling and mixing circuit as claimed in claim 1, wherein:

said means for deriving a differential current comprises a first current mirror circuit coupled to said first and second differential transistor-pairs for deriving a first differential current; and said frequency doubling and mixing circuit further comprises a second current mirror circuit coupled to said first current mirror circuit;

said first current mirror circuit provides said first differential current to said second current mirror circuit which provides, in accordance therewith, said differential current to said differential amplifying circuit.

12. A frequency doubling and mixing circuit as claimed in claim 11, further comprising a third current mirror circuit, coupled to said differential amplifying circuit and acting as a load of said differential amplifying circuit to cause said differential amplifying circuit to provide said circuit output signal.

13. A frequency doubling and mixing circuit comprising:

means for providing a signal whose frequency is to be doubled;

an input terminal-pair for receiving said signal;

means for providing a mixing signal;

an input terminal for receiving said mixing signal;

a first differential transistor-pair comprising first and second transistors each having an emitter, collector and base, said second transistor having a first resistor coupled to said emitter thereof, and said emitters of said first and second transistors being coupled together through said first resistor;

a second differential transistor-pair comprising third and fourth transistors each having an emitter, collector and base, said third transistor having a second resistor coupled to said emitter thereof, and said emitters of said third and fourth transistors being coupled together through said second resistor;

said collectors of said first and fourth transistors being coupled together at a first node and said collectors of said second and third transistors being coupled in together at a second node;

said bases of said first and third transistors being coupled in common to a first input terminal of said input terminal-pair, and said bases of said second and fourth transistors being coupled in common to a second input terminal of said input terminal-pair;

a fifth transistor, having an emitter, base and collector, for supplying a constant current to said first differential transistor-pair; and a sixth transistor, having an emitter, base and collector, for supplying a constant current to said second differential transistor-pair;

said emitters of said fifth and sixth transistors being coupled in common, said bases of said fifth and sixth transistors being coupled in common to said second input terminal, said collector of said fifth transistor being coupled to said emitter of said first transistor and said first resistor, said collector of said sixth transistor being coupled to said emitter of said fourth transistor and said second resistor, and said mixing signal being provided between the commonly coupled bases and emitters of said fifth and sixth transistors;

whereby said first and second differential transistor-pairs and said fifth and sixth transistors cooperate to double said frequency of said signal and to mix said doubled frequency signal with said mixing signal to provide a circuit output signal in accordance therewith at at least one of said first and second nodes.

14. A frequency doubling and mixing circuit, comprising:

means for providing a signal whose frequency is to be doubled;

an input terminal-pair for receiving said signal;

means for providing a mixing signal;

an input terminal for receiving said mixing signal;

a first differential transistor-pair comprising first and second transistors each having an emitter, collector and base, said emitters of said first and second transistors being coupled in common and having relative emitter sizes of K and 1, respectively where K is larger than 1;

a second differential transistor-pair comprising third and fourth transistors each having an emitter, collector and base, said emitters of said third and fourth transistors being coupled in common and having relative emitter sizes of K and 1, respectively;

said collectors of said first and third transistors being coupled in common at a first node and said collectors of said second and fourth transistors being coupled in common at a second node;

said bases of said first and fourth transistors being coupled in common to a first input terminal of said input terminal-pair, and said bases of said second and third transistors being coupled in common to a second input terminal of said input terminal-pair;

a fifth transistor having an emitter, base and collector, for supplying a constant current to said first differential transistor-pair; and a sixth transistor, having an emitter, collector and base for supplying a constant current to said second differential transistor-pair;

said emitters of said fifth and sixth transistors being coupled in common, said bases of said fifth and sixth transistors being coupled in common to said input terminal, said collector of said fifth transistor being coupled to said emitters of said first and second transistors, said collector of said sixth transistor being coupled to said emitters of said third and fourth transistors, and said mixing signal being provided between the commonly coupled bases and emitters of said fifth and sixth transistors;

whereby said first and second differential transistor-pairs and said fifth and sixth transistors cooperate to double said frequency of said signal and to mix said doubled frequency signal with said mixing signal to provide a circuit output signal in accordance therewith at at least one of said first and second nodes.

15. A frequency doubling and mixing circuit, comprising:

means for providing a signal whose frequency is to be doubled;

an input terminal-pair for receiving said signal;

means for providing a mixing signal;

an input terminal for receiving said mixing signal;

a first differential transistor-pair comprising a first transistor having an emitter, base and collector, a first resistor being coupled to said emitter of said first transistor, and a second transistor having an emitter, base and collector, a second resistor being coupled to said emitter of said second transistor, said emitters of said first and second transistors being coupled in common through said first and second transistors;

said emitters of said first and second transistors having relative emitter sizes of K and 1, respectively, where K is larger than 1;

said second resistor having a resistance value of K times as large as a resistance value of said first resistor;

a second differential transistor-pair comprising a third transistor having an emitter, base and collector, a third resistor being coupled to said emitter of said third transistor, and a second transistor having an emitter, base and collector, a fourth resistor being coupled to said emitter of said fourth transistor, said emitters of said third and fourth transistors being coupled in common through said third and fourth resistors;

said emitters of said third and fourth transistors having relative emitter sizes of K and 1, respectively;

said fourth resistor having a resistance value of K times as large as a resistance value of said third resistor;

said collectors of said first and third transistors being coupled in common at a first node and said collectors of said second and fourth transistors being coupled in common at a second node;

said bases of said first and fourth transistors being coupled in common to a first input terminal of said input terminal-pair, and said bases of said second and third transistors being coupled in common to a second input terminal of said input terminal-pair;

a fifth transistor having an emitter, base and collector, for supplying a constant current to said first differential transistor-pair; and a sixth transistor having an emitter, base and collector for supplying a constant current to said second differential transistor-pair;

said emitters of said fifth and sixth transistors being coupled in common, said bases of said fifth and sixth transistors being coupled in common to said input terminal, said collector of said fifth transistor being coupled to said first and second resistors, said collector of said sixth transistor being coupled to said third and fourth resistors, and said mixing signal being provided between the commonly coupled bases and emitters of said fifth and sixth transistors;

whereby said first and second differential transistor-pairs and said fifth and sixth transistors cooperate to double said frequency of said signal to create a double frequency signal and to mix said double frequency signal with said mixing signal to provide a circuit output signal in accordance therewith at least one of said first and second nodes.

16. A frequency doubling and mixing circuit comprising:

a first input terminal-pair having first and second terminals for receiving a signal whose frequency is to be doubled;

a second input terminal-pair having third and fourth terminals for receiving a mixing signal;

a first differential amplifying circuit comprising first and second differential transistor-pairs;

said first differential transistor-pair comprising first and second transistors each having an emitter, base and collector, a first resistor being coupled to said emitter of said second transistor and said emitters of said first and second transistors being coupled in common by said first resistor;

said second differential transistor-pair comprising third and fourth transistors each having an emitter, base and collector, a second resistor being coupled to said emitter of said third transistor and said emitters of said third and fourth transistors being coupled in common by said second resistor;

said collectors of said first and fourth transistors being coupled in common and providing a first output current;

said collectors of said second and third transistors being coupled in common and providing a second output current;

said bases of said first and third transistors being coupled in common to said first input terminal of said first input terminal pair and said bases said second and fourth transistors being coupled in common to said second input terminal of said first input terminal pair;

a first constant current source for supplying a constant current of said first differential transistor-pair, said first constant current source being coupled to said emitter of said first transistor and said first resistor;

a second constant current source for supplying a constant current to said second differential transistor-pair, said second constant current source being coupled to said emitter of said fourth transistor and said second resistor;

a second differential amplifying circuit having an output terminal and comprising a third differential transistor-pair comprising fifth and sixth transistors each having an emitter, base and collector;

said emitters of said fifth and sixth transistors being coupled in common and said bases of said first and sixth transistors being coupled in common to said first and second terminals of said second input terminal-pair, respectively; and a first current mirror circuit for generating a differential current in accordance with said first and second output currents of said first differential amplifying circuit and for driving said second differential amplifying circuit in accordance with said differential current;

whereby said output terminal of said second differential amplifying circuit provides a circuit output signal in accordance with said signal and said mixing signal.

17. A frequency doubling and mixing circuit as claimed in claim 16, further comprising a control circuit for subtracting a constant direct current from said differential current to provide a reduced differential current for driving said second differential amplifying circuit.

18. A frequency doubling and mixing circuit as claimed in claim 17, wherein said control circuit includes a constant current source coupled in parallel with a transistor in said current mirror circuit.

* * * * *

UNITED STATES PATENT AND TRADEMARK OFFICE
CERTIFICATE OF CORRECTION

PATENT NO. : 5,319,267
DATED : June 7, 1994
INVENTOR(S) : Kimura

It is certified that error appears in the above-identified patent and that said Letters Patent is hereby corrected as shown below:

Col. 5, line 38, delete "tan h" insert --tanh--;

Col. 5, line 40, delete "tan h" insert --tanh--.

Col. 6, line 4, delete "tan h" insert --tanh--;

Col. 6, line 32, delete "tan h" insert --tanh--;

Col. 6, line 40, delete "tan h" insert --tanh--;

Col. 6, line 40, after "+" insert --...--.

Col. 7, line 64, delete "Q21 and Q22" insert --Q22 and Q23--.

Col. 11, lines 46 and 48, delete "tan h" insert --tanh--;

Col. 11, line 48, after "+" insert --...--.

Signed and Sealed this

Fifteenth Day of November, 1994

BRUCE LEHMAN

Attest:

Attesting Officer

Commissioner of Patents and Trademarks